United States Patent
Revaux et al.

(10) Patent No.: US 10,580,956 B2
(45) Date of Patent: Mar. 3, 2020

(54) METHOD FOR PRODUCING A STACK OF LAYERS FOR A MATRIX THERMAL SENSOR

(71) Applicants: COMMISSARIAT A L'ENERGIE ATOMIQUE ET AUX ENERGIES ALTERNATIVES, Paris (FR); IDEMIA IDENTITY & SECURITY FRANCE, Issy les Moulineaux (FR)

(72) Inventors: Amelie Revaux, Voiron (FR); Joel Yann Fourre, Issy-les-Moulineaux (FR); Jean-Francois Mainguet, Grenoble (FR)

(73) Assignees: COMMISSARIAT A L'ENERGIE ATOMIQUE ET AUX ENERGIES ALTERNATIVES, Paris (FR); IDEMIA IDENTITY & SECURITY FRANCE, Issy les Moulineaux (FR)

( * ) Notice: Subject to any disclaimer, the term of this patent is extended or adjusted under 35 U.S.C. 154(b) by 0 days.

(21) Appl. No.: 16/186,926

(22) Filed: Nov. 12, 2018

(65) Prior Publication Data

US 2019/0148618 A1    May 16, 2019

(30) Foreign Application Priority Data

Nov. 13, 2017    (FR) .................... 17 60652

(51) Int. Cl.
*H01L 37/02*    (2006.01)
*G01J 5/34*    (2006.01)
(Continued)

(52) U.S. Cl.
CPC ............. *H01L 37/02* (2013.01); *B32B 7/12* (2013.01); *B32B 9/045* (2013.01); *G01J 5/34* (2013.01);
(Continued)

(58) Field of Classification Search
None
See application file for complete search history.

(56) References Cited

U.S. PATENT DOCUMENTS 5,945,673 A * 8/1999 Beratan ............... G01J 5/34
 250/338.3
5,949,071 A * 9/1999 Ruffner ............... G01J 5/20
 250/338.3
(Continued)

FOREIGN PATENT DOCUMENTS

EP    0 840 250 A1    5/1998
EP    2 385 486        11/2011
(Continued)

OTHER PUBLICATIONS

U.S. Appl. No. 15/662,805, filed Jul. 28, 2017, 2018/0032782 A1, Jean-Francois Mainguet et al.
(Continued)

*Primary Examiner* — Asok K Sarkar
(74) *Attorney, Agent, or Firm* — Oblon, McClelland, Maier & Neustadt, L.L.P.

(57) ABSTRACT

A method produces a matrix of pixels of a thermal sensor, suitable for passive addressing. The matrix of pixels includes a layer including a first series of electrically conducting strips, forming charge collection macro-electrodes; a layer including a pyroelectric material; and a layer including a second series of electrically conducting strips, forming heating strips. The method includes a step of transfer of one on the other of a first and a second elementary stack, the first elementary stack including the first series of strips, and the second elementary stack including the second series of strips. This method makes it possible to relax the manufacturing constraints of the series of strips.

14 Claims, 3 Drawing Sheets

(51) Int. Cl.
*B32B 7/12* (2006.01)
*B32B 9/04* (2006.01)
*G06K 9/00* (2006.01)

(52) U.S. Cl.
CPC ...... *G06K 9/0002* (2013.01); *B32B 2307/202* (2013.01); *B32B 2457/00* (2013.01); *G01J 2005/345* (2013.01)

(56) References Cited

U.S. PATENT DOCUMENTS 6,137,107 A * 10/2000 Hanson .................. G01J 5/10
250/332
9,658,110 B1 * 5/2017 Edwards .................. G01J 5/12

FOREIGN PATENT DOCUMENTS

| FR | 3 044 407 A1 | 6/2017 |
| FR | 3 054 698 A1 | 2/2018 |

OTHER PUBLICATIONS

U.S. Appl. No. 15/662,778, filed Jul. 28, 2017, 2018/0032781 A1, Jean-Francois Mainguet et al.
U.S. Appl. No. 16/064,759, filed Jun. 21, 2018, Jean-Francois Mainguet et al.
U.S. Appl. No. 16/041,233, filed Jul. 20, 2018, Jean-Francois Mainguet et al.
U.S. Appl. No. 14/583,967, filed Dec. 29, 2014, 2015/0191309 A1, Jean-Francois Mainguet et al.
U.S. Appl. No. 15/900,505, filed Feb. 20, 2018, 2018/0240843 A1, Jean-Francois Mainguet et al.
U.S. Appl. No. 15/922,204, filed Mar. 15, 2018, 2018/0269240 A1, Jean-Francois Mainguet et al.
U.S. Appl. No. 15/779,787, filed May 29, 2018, Jean-Francois Mainguet et al.
French Preliminary Search Report dated Jul. 10, 2018 in French Application 17 60652 filed on Nov. 13, 2017 (with English Translation of Categories of Cited Documents).

* cited by examiner

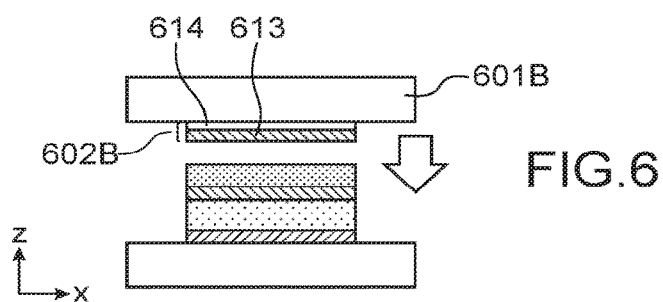
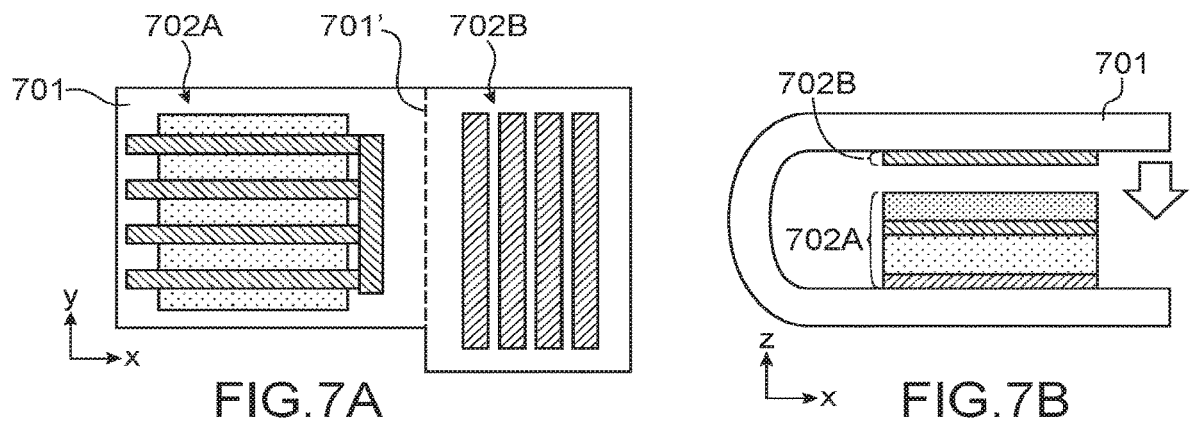
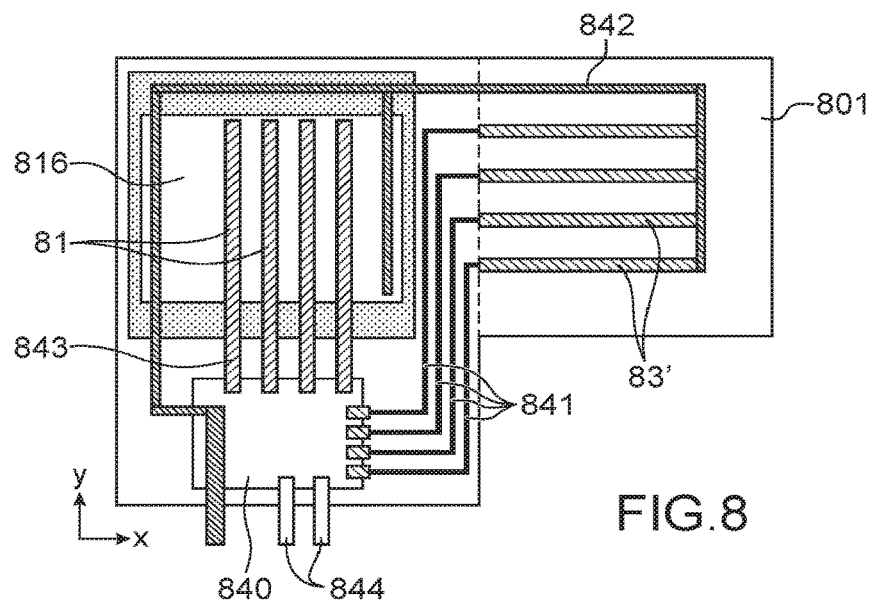

METHOD FOR PRODUCING A STACK OF LAYERS FOR A MATRIX THERMAL SENSOR

TECHNICAL FIELD

The invention relates to a method for producing a matrix of pixels of a thermal sensor of pyroelectric sensor type, suitable for the implementation of passive addressing of pixels.

Such a sensor forms for example a papillary print sensor, notably a finger print sensor.

PRIOR ART

A pyroelectric sensor exploits the pyroelectric properties of a material, that is to say its capacity to generate electrical charges in response to a variation in temperature.

Such a sensor comprises a matrix of pyroelectric capacitances, each forming a transducer to translate a temporal variation in temperature into an electrical signal.

Each pyroelectric capacitance comprises a pyroelectric material portion, arranged between a lower electrode and an upper electrode. One of the electrodes is placed at a constant potential, and forms a reference electrode. The other electrode, named charge collection electrode, collects the pyroelectric charges generated by the pyroelectric material in response to a variation in temperature. The charge collection electrode is connected to a reading circuit, for measuring the quantity of collected charges.

In operation, an object is pressed against a contact surface of the sensor.

The detection may simply exploit a temperature difference between this object and said contact surface. The sensor then carries out a passive type detection.

In the case of a finger print detection, the finger is pressed against the contact surface.

At the level of the ridges of the print, the finger is in direct physical contact with the sensor. A thermal transfer between the skin and the contact surface of the sensor takes place by conduction, which leads to a first temporal variation in temperature.

At the level of the valleys of the print, the finger is not in direct physical contact with the sensor. A thermal transfer between the skin and the contact surface of the sensor takes place through air. Air has heat insulating properties, which leads to a second temporal variation in temperature, less important.

The difference between these two temporal variations in temperature is reflected by a difference between the signals measured by the pyroelectric capacitances, depending on whether they lie under a valley or under a ridge of the print. The image of the print then has a contrast that depends on this difference.

After several seconds, the temperature of the finger and the temperature of the contact surface are homogenised, and it is no longer possible to obtain a satisfactory contrast.

To overcome this drawback, heating means are added under the contact surface, in order to dissipate a certain quantity of heat in each pixel of the sensor. The variation in temperature measured in each pixel of the sensor then relates to the measure to which this quantity of heat is evacuated from the pixel. This makes it possible to improve, and to conserve over time, the contrast of an image acquired by means of said sensor. The sensor then carries out an active type detection.

In the case of finger print detection, the variation in temperature is important at the level of the valleys of the print, where heat is transferred to the finger only through air, and lower at the level of the ridges of the print, where heat is transferred efficiently to the finger, by conduction.

In a pyroelectric type matrix thermal sensor, the addition of heating means may be exploited to carry out passive addressing of the pixels of the sensor.

Each pixel comprises a pyroelectric capacitance, and a heating element.

The pixels are arranged according to lines and columns. The terms "line" and "column" may be exchanged, which would correspond to a simple 90° rotation of the sensor.

The elements for heating a same line of pixels are electrically connected together to form a heating strip. Each heating strip is configured to be able to be activated independently of the other heating strips. In other words, the elements for heating the pixels of a same line of pixels are able to heat the pyroelectric material portions of the pixels of said line, independently of the elements for heating the pixels of the other lines.

Moreover, the charge collection electrodes of a same column of pixels are electrically connected together to form a charge collection macro-electrode. Each charge collection macro-electrode is formed by an electrically conducting strip, in contact with the pyroelectric material portions of the pixels of said column of pixels, and distinct from the electrically conducting strips forming the charge collection macro-electrodes of the other columns of pixels.

Each charge collection macro-electrode makes it possible to measure the sum of the pyroelectric charges, generated in a same column of pixels.

If at each instant only one of the heating strips is activated, in each column of pixels there is only one pixel that generates pyroelectric charges. The pyroelectric charges collected by the charge collection macro-electrode then relate to this single pixel.

A passive addressing of the pixels of the sensor is thereby carried out, without selection transistor within the matrix of pixels.

Such a sensor is described in the French patent application n° 16 57391, filed on the 27 Jul. 2016.

FIGS. 1A and 1B schematically represent a first embodiment of a stack of layers, 102, forming the matrix of pixels of such a sensor.

For greater clarity, the axes (Ox), (Oy) and/or (Oz) of an orthonormal coordinate system are represented in the figures.

In FIG. 1A, the stack 102 is represented according to a sectional view, in a plane parallel to the plane (xOz).

In FIG. 1B, the stack 102 is represented according to a top view, in a plane parallel to the plane (xOy).

The stack 102 extends onto a mechanical support 101.

The support 101 is vertically delimited by two planes parallel with each other, parallel to the plane (xOy). The plane of the support designates a plane parallel to an upper face thereof, parallel to the plane (xOy).

The stack 102 includes, superimposed one on top of the other, in this order, and along an axis (Oz) orthogonal to the plane of the support:
- a layer 111 of charge collection electrodes, including a first series of electrically conducting strips 11, parallel with each other, forming the charge collection macro-electrodes;
- a layer 112 including a pyroelectric material;

a heating layer 113, including a second series of electrically conducting strips 13, parallel with each other, forming the heating strips to provide heating by Joule effect; and a protective layer 114, optional.

In the example represented in FIGS. 1A and 1B, the heating layer 113 also includes a third series of strips 15, electrically conducting, parallel to the heating strips 13, and forming reference macro-electrodes common to all the pixels of a same line of pixels.

The heating strips 13 here extend along the axis (Ox).

The charge collection macro-electrodes 11 extend along the axis (Oy).

Each pixel 10 extends, in the stack 102, into a region situated at the intersection between a charge collection macro-electrode 11, and a pair of a reference macro-electrode 15 and a neighbouring heating strip 13.

The heating strips 13 each have a first end, suitable to being connected to a non-zero electrical potential, and a second end, preferably connected to the ground. Here, the second ends of all the heating strips are connected together through a conducting portion 23.

In the same way, the reference macro-electrodes 15 each have a first end, suitable to being connected to a fixed electrical potential, and a second end, preferably connected to the ground.

In FIG. 1C is represented an alternative, in which the functions of reference electrode and heating are ensured by a same electrically conducting strip, 13'. The electrically conducting strips 13' each have a first end, suitable to being connected to a fixed and non-zero electrical potential, and a second end, preferably connected to the ground.

FIG. 2 illustrates a second embodiment of a stack of layers, 202, forming the matrix of pixels of such a sensor.

The stack 202 includes, superimposed one on top of the other, in this order, and along an axis (Oz) orthogonal to the plane of the support:

a layer 211 of charge collection electrodes, including the charge collection macro-electrodes such as described above;

a layer 212 including a pyroelectric material;

an electromagnetic shielding layer 216, electrically conducting;

an electrically insulating layer 217, made of dielectric material;

a heating layer 213, including the heating strips such as described above; and a protective layer 214, optional.

The electromagnetic shielding layer 216 is suitable to being connected to a constant potential, notably to the ground. It offers a protection with regard to electrostatic parasites, notably around 50 Hz, caused for example by the contact with skin when the finger touches the contact surface of the sensor. It also forms a reference electrode common to all the pixels of the matrix of pixels.

The layer 216 extends in a single piece and preferably without opening over the whole extent of the matrix of pixels, in a plane (xOy). It also forms a common reference electrode for all of the pixels of the matrix of pixels.

The objective of the invention is to propose an advantageous method for producing a matrix of pixels for a pyroelectric type thermal sensor with passive addressing, such as described with reference to FIGS. 1A to 1C, and 2.

DESCRIPTION OF THE INVENTION

This objective is reached with a method for producing a matrix of pixels for a thermal sensor, each pixel including a pyroelectric capacitance formed by a portion including a pyroelectric material arranged between a charge collection electrode and a reference electrode, and a heating element, the heating elements of the pixels of a same line of pixels being integrally formed together into a same heating strip, the charge collection electrodes of the pixels of a same column of pixels being integrally formed together into a same charge collection macro-electrode, and the matrix of pixels being constituted of a stack of layers comprising:

a layer of charge collection electrodes, including a first series of electrically conducting strips parallel with each other, forming the charge collection macro-electrodes;

a layer including a pyroelectric material comprising the pyroelectric material portions of each of the pixels; and a heating layer, including a second series of electrically conducting strips parallel with each other, forming the heating strips.

According to the invention, the method includes a step of transfer of one on the other of a first and a second elementary stack, to form said stack of layers. The first elementary stack includes the layer of charge collection electrodes, and the second elementary stack includes the heating layer. In other words, the first elementary stack is transferred onto the second, or vice versa, to form the matrix of pixels of a pyroelectric thermal sensor with passive addressing.

In practice, each pixel includes a pyroelectric capacitance, that is to say a pyroelectric material portion, a charge collection electrode, and a reference electrode. If need be, a same element forms both the reference electrode and the heating element of the pixel (see FIG. 1C here above).

In the stack, the layer including a pyroelectric material is situated between the layer of charge collection electrodes, and the heating layer. The layer including a pyroelectric material is not necessarily in direct physical contact with the layer of charge collection electrodes and/or with the heating layer. One or more additional layers may be intercalated between the layer including a pyroelectric material and the layer of charge collection electrodes, and/or between the layer including a pyroelectric material and the heating layer.

Each pixel of the matrix of pixels is thus situated, in the stack of layers, in a region at the intersection between a strip of the first series of strips and a strip of the second series of strips. To do so, the strips of the first and the second series of strips are not parallel with each other.

Throughout the text, the term "strip" is not limited to a thin shape, of long length and of constant width. This term can designate any thin shape, longer than wide. The width is not necessarily constant along the elongation axis of the strip. For example, a heating strip may be constituted of a succession of narrow and wide portions, where narrow portions are each centred on a pixel of the sensor and wide portions are each arranged astride two neighbouring pixels.

It is understood that the portions including a pyroelectric material, each associated with one of the pixels of the matrix of pixels, extend into the layer including a pyroelectric material.

For the reasons set out above, the matrix of pixels is suitable for the implementation of passive addressing.

An obvious solution for producing the stack of layers according to the invention consists in depositing successively, one above the other, each of the constituent layers of the stack.

It is here proposed to use rather two distinct stacks, transferred one onto the other to form the complete stack, that is to say the matrix of pixels of the sensor.

Thus, the heating strips are not produced above the layer including a pyroelectric material.

This thus avoids the necessity of compatibility between the steps of producing the heating strips, and the pyroelectric material.

For example, when the production of the heating strips involves the use of one or more solvent(s), it is no longer necessary that these solvents are compatible with the pyroelectric material.

In the same way, when the heating strips are produced by deposition of a metallic ink, it is no longer necessary that this ink is compatible with the pyroelectric material.

The constraints on the production of the heating strips are thus relaxed. In other words, the invention gives access to a wider range of materials and methods for producing the heating strips. This makes it possible, notably, to produce the heating strips with a finer distribution pitch than in the prior art. It is thus possible to obtain a sensor having improved resolution.

Moreover, the invention makes it possible that the heating strips are produced on a surface have a lower roughness, in comparison with the upper surface of a layer made of pyroelectric material. It is thereby possible to control more easily, and/or with greater precision, the geometry of the heating strips, as well as their distribution pitches.

For example, poly(vinylidene fluoride) (PVDF) and derivatives thereof (notably the PVDF-TrFE copolymer, TrFE for trifluoroethylene), commonly used to produce the layer including a pyroelectric material, have a high surface roughness (several hundreds of nanometres). Less rough supports are thus easily found, on which the heating strips are produced.

It may also be remarked that in the method according to the invention, the heating strips are not produced above the charge collection macro-electrodes. This thus avoids potential planeness defects on the surface receiving the heating strips, linked to the presence of the charge collection macro-electrodes below.

When the charge collection electrodes are distinct from each other, the matrix of pixels comprises transistors for controlling these electrodes, spread out in lines and in columns. Each heating strip must then extend exactly above or in the vicinity of a command line of a line of transistors.

Here, the charge collection electrodes of a same column of pixels are integrally formed together into a charge collection macro-electrode. This thus avoids control transistors spread out in lines and columns in the matrix of pixels. This makes it possible to relax the constraint relating to the precise alignment of a heating strip with respect to a command line of a line of transistors. Consequently, in the method according to the invention, the transfer step does not require great precision of relative orientation of the two elementary stacks. In particular, it is not necessary that the heating strips are oriented exactly at 90° relative to the charge collection macro-electrodes.

According to one advantageous embodiment, the first and second elementary stacks are configured so that, after the transfer step, the stack of layers includes, superimposed one on top of the other in this order:
the layer of charge collection electrodes;
the layer including a pyroelectric material;
an electromagnetic shielding layer, electrically conducting;
an electrical insulation layer; and
the heating layer.

The electromagnetic shielding layer then further forms the reference electrodes of the pixels of the matrix of pixels.

Other optional features of the method according to the invention are listed in the dependent claims.

The invention also relates to a system suitable for the implementation of a variant of the method wherein a single substrate is folded, the system including the first elementary stack, the second elementary stack and the single substrate, the first elementary stack extending onto a first region of the single substrate, and the second elementary stack extending onto a second region of the single substrate.

An integrated circuit and electrically conducting lines may be situated on the single substrate, the electrically conducting lines each extending between the integrated circuit and one end of a strip of the first series of strips, respectively of the second series of strips.

The shape of the single substrate is advantageously adapted so that, after the folding, at least one end of each strip of the first series of strips is not covered by the second region of the single substrate, and at least one end of each strip of the second series of strips is not covered by the first region of the single substrate.

The invention finally relates to a system suitable for the implementation of a variant of the method including transfer of one above the other of a first substrate and a second substrate distinct from the first substrate, the system including the first elementary stack, the second elementary stack, a first substrate, and a second substrate distinct from the first substrate, the first elementary stack extending onto the first substrate, and the second elementary stack extending onto the second substrate.

BRIEF DESCRIPTION OF THE DRAWINGS

The present invention will be better understood on reading the description of exemplary embodiments given for purely indicative purposes and in no way limiting, while referring to the appended drawings, in which:

FIGS. 5 and 6 illustrate different alternatives of this first embodiment;

FIGS. 7A and 7B schematically illustrate a second embodiment of a method according to the invention; and FIG. 8 illustrates an alternative of this second embodiment.

DETAILED DESCRIPTION OF PARTICULAR EMBODIMENTS

Figure 2:
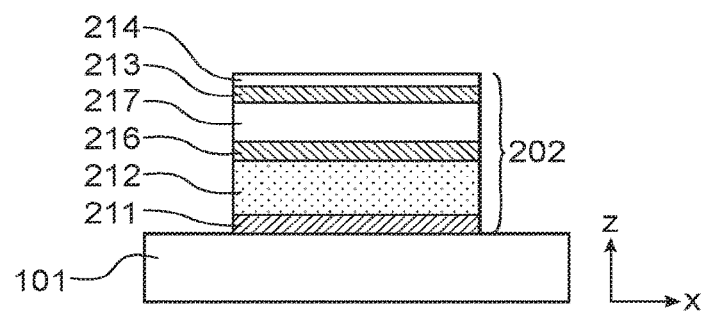
FIG. 2A schematically illustrates a second embodiment of a matrix of pixels that can be produced thanks to the method according to the invention.

Hereafter, but in a non-limiting manner, examples are described of methods for producing a stack of the type of that described with reference to FIG. 2, said stack forming a matrix of pixels.

Methods for producing first and second elementary stacks 302A, 302B are described hereafter. Even so, the method according to the invention does not necessarily include the implementation of these steps.

Figure 3A:
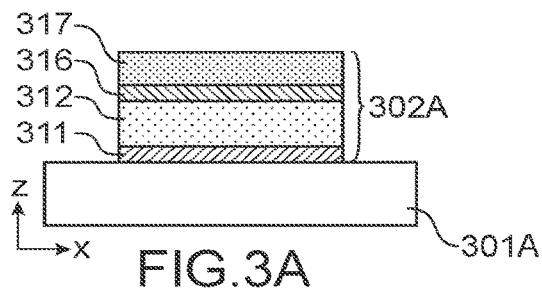
FIGS. 3A to 3C, and 4 schematically illustrate a first embodiment of a method according to the invention.
Figure 3B:
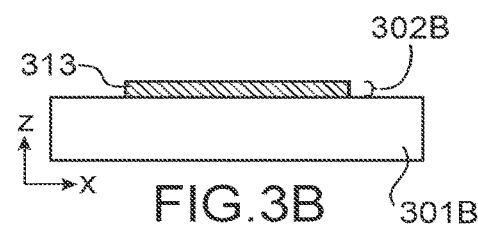

The method according to the invention uses a first elementary stack, 302A (FIG. 3A), and a second elementary stack, 302B (FIG. 3B).

The first elementary stack, 302A, here extends onto a first substrate, 301A.

The first substrate 301A is for example made of glass, silicon, a plastic such as poly(ethylene terephthalate) (PET), poly(ethylene naphthalate) (PEN), polyimide (Kapton film), etc.

It is for example a flexible substrate.

The first elementary stack 302A comprises a series of layers, superimposed one on top of the other along the axis (Oz), that is to say along an axis orthogonal to the plane of the first substrate 301A.

The first elementary stack 302A here comprises, superimposed above the first substrate 301A:
- a layer 311 of charge collection electrodes, such as described in the introduction, including metal strips parallel with each other forming charge collection macro-electrodes;
- a layer 312 including a pyroelectric material, for example PVDF or AlN (aluminium nitride), or PZT (lead zirconate titanate), etc.;
- an electromagnetic shielding layer 316, electrically conducting, also forming a reference electrode common to all the pixels of the matrix of pixels; and
- a layer of adhesive 317, preferably electrically non-conducting.

The charge collection macro-electrodes are spread out according to a pitch less than or equal to 150 μm, preferentially less than or equal to 100 μm, and even more preferentially according to a pitch less than or equal to 51 μm.

This pitch is for example around 80 μm (i.e. a resolution of 320 dpi). For example, the width (along (Ox)) of a macro-electrode is 40 μm, and the width of the interstice between two neighbouring macro-electrodes is 40 μm.

In an alternative, this pitch is 50.8 μm (i.e. a resolution of 500 dpi). For example, the width of a macro-electrode is 25.4 μm, and the width of the interstice between two neighbouring macro-electrodes is 25.4 μm.

Before the production of the charge collection macro-electrodes, the first substrate 301A undergoes a cleaning step (ethanol or acetone or plasma, depending on the substrate).

The macro-electrodes are next produced on the first substrate 301.

Different techniques for producing macro-electrodes may be implemented:
- lithography (lithography methods of the field of printed circuits),
- deposition of a full layer electrically conducting then laser ablation (for example deposition under vacuum of physical vapour deposition or chemical vapour deposition type, or deposition by cathodic sputtering, etc.),
- screen printing type printing (with use of a mask or stencil),
- printing of heliogravure type (technique in which an ink is transferred directly from an engraved cylinder onto a final surface, more particularly suitable for small distribution pitches of the metal strips),
- printing of "offset gravure" type (technique in which an ink is transferred from an engraved cylinder onto a final surface, through at least one intermediate cylinder, more particularly suitable for small distribution pitches of the metal strips), etc.
- ink jet type printing, etc.

When the macro-electrodes are produced by printing, an electrically conducting ink, for example a metallic ink, is deposited, dried then annealed. The annealing is carried out for example in a heat chamber, at a temperature preferably comprised between 20° C. and 200° C. depending on the nature of the substrate and the ink.

The macro-electrodes are for example strips of gold of 30 nm thickness, deposited by cathodic sputtering on a first substrate 301A constituted of a sheet of PEN of 125 μm thickness.

In an alternative, the macro-electrodes are silver strips of 1.5 μm thickness, printed by offset gravure on a first substrate 301A constituted of a sheet of PEN of 125 μm thickness.

The layer 312 including a pyroelectric material has for example a thickness comprised between 2 μm and 4 μm.

It is deposited for example by screen printing or by spin-coating.

The pyroelectric material may be dispersed or dissolved in an ink, then deposited by a printing method. After having been deposited, the ink is dried then annealed, for example in a heating chamber.

An ink based on a PVDF-TrFE copolymer is for example used. The relative quantity of TrFE (trifluoroethylene) compared to PVDF in the ink impacts the pyroelectric coefficient and the Curie temperature of the ink (temperature above which a material loses its pyroelectric properties). Depending on the type of substrate used (and thus the accessible annealing temperatures), different formulations and ratios of PVDF-TrFE may be used.

In an alternative, an ink based on PZT or $BaTiO_3$ (barium titanate) is used.

The invention is not however limited to a layer 312 produced from an ink.

The electromagnetic shielding layer 316 is constituted of an electrically conducting material, and preferably a poor heat conductor. The poor heat conduction makes it possible to limit thermal transfers in the layer 316, from one pixel to another of the matrix of pixels. The layer 316 has a reduced thickness, favouring heat transfers in the sense of the thickness. It is constituted for example of a layer of 0.5 μm thickness made of PEDOT:PSS (mixture of poly(3,4-ethylenedioxythiophene) (PEDOT) and sodium poly(styrene sulphonate) (PSS)). If the material of the layer 316 is better electricity conductor, the layer 316 may be less thick. If the material of the layer 316 is better heat conductor, the layer 316 has to be less thick.

The layer of adhesive 317 is electrically insulating.

It is for example an epoxy (epoxide polymer) adhesive.

The layer 317 also forms the electrical insulation layer such as described in the introduction, which makes it possible to limit the thickness of the matrix of pixels, and thereby reach greater image resolutions (see below).

The thickness of the layer 317 is advantageously less than 5 μm, for example 1 μm.

The second elementary stack, 302B, here extends onto a second substrate, 301B.

The second substrate 301B may be identical to the first substrate 301A. In an alternative, it may have a lower thickness, less than or equal to 30 μm, for example 15 μm.

The second elementary stack 302B is constituted uniquely of the heating layer 313, such as described in the introduction.

The heating strips of the layer 313 are spread out preferably according to a distribution pitch identical to the distribution pitch of the charge collection macro-electrodes.

Whatever the case, the heating strips of the layer 313 are spread out according to a pitch less than or equal to 150 μm, preferentially less than or equal to 100 μm, and even more preferentially according to a pitch less than or equal to 51 μm.

This pitch is for example around 80 µm. For example, the width (along (Oy)) of a heating strip is 40 µm, and the width of the interstice between two neighbouring heating strips is 40 µm.

In an alternative, this pitch is 50.8 µm. For example, the width of a heating strip is 25.4 µm, and the width of the interstice between two neighbouring heating strips is 25.4 µm.

Whatever the case, this pitch is preferably identical to the distribution pitch of the charge collection macro-electrodes (to have square pixels).

Before producing the heating strips on the second substrate 301B, the latter undergoes a step of cleaning (ethanol or acetone or plasma, depending on the substrate).

The heating strips of the layer 313 are next produced by methods similar to those that can be used for producing the charge collection macro-electrodes.

If need be, the heating strips and the charge collection macro-electrodes may be produced jointly, in a same manufacturing step.

The heating strips are for example gold strips of 30 nm thickness (along (Oz)), deposited by cathodic sputtering on a second substrate 301B constituted of a sheet of PEN of 125 µm thickness.

In an alternative, the heating strips are silver strips of 1.5 µm thickness, printed by offset gravure on a second substrate 301B constituted of a sheet of PEN of 125 µm thickness.

The charge collection macro-electrodes and the heating strips may have the same characteristics (material and dimensions), which makes it possible that they are produced jointly. However, the charge collection macro-electrodes support in practice lower currents than the heating strips, and can, in an alternative, have smaller dimensions, or be constituted of materials that conduct electricity less well.

Figure 3C:
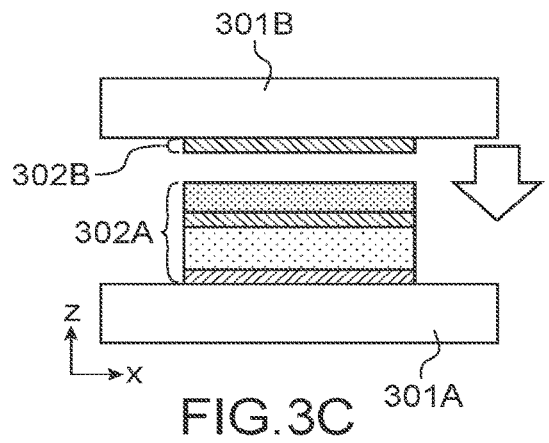

In FIG. 3C is illustrated the transfer step, defining the method according to the invention.

In the course of this step, the assembly constituted of the second elementary stack 302B and the second substrate 302B is turned over (180° rotation, around (Ox) or (Oy)), then deposited on the adhesive layer 317 of the first stack 302A.

The transfer step is preferably followed by a step of cross-linking the adhesive, to make the first stack 302A and the second stack 302B integral with each other. The cross-linking of the adhesive may be carried out under the action of heat, or by irradiation by a beam with a predetermined wavelength (for example infrared or ultra-violet), or by irradiation by an electron beam.

During the transfer step, the lateral and angular alignment of the second elementary stack 302B relative to the first elementary stack 302A is not crucial. This positioning freedom is directly linked to the solution of passive addressing of pixels, without transistors between the pixels of the matrix of pixels.

Figure 4:
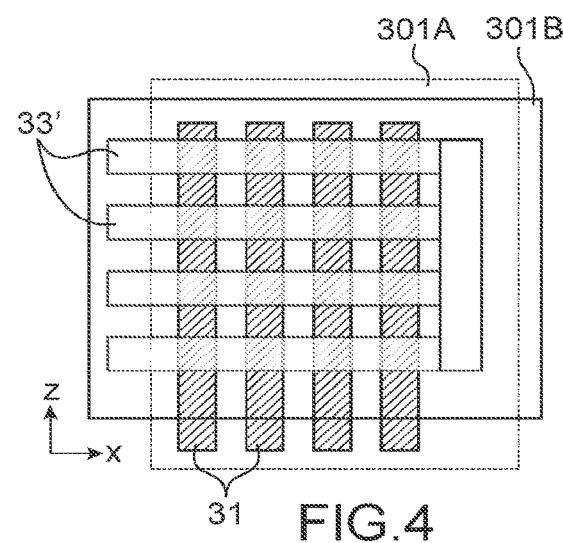

FIG. 4 schematically illustrates, according to a top view, the total stack obtained at the end of the transfer step. Here, the charge collection macro-electrodes, 31, are oriented at 90° relative to the heating strips 33'.

In the example illustrated in FIG. 4, the dimensions of the first substrate 301A and the second substrate 302B are adapted so that, after the transfer step:
 each macro-electrode 31 has one end not covered by the second substrate 301B; and
 each heating strip 33' has one end not covered by the first substrate 301A.

This configuration makes it possible to facilitate access to the heating strips and to the macro-electrodes, for connection to heating control circuits, respectively to reading circuits.

The reading and heating control circuits are for example produced on a substrate distinct from the first and second substrates 301A, 301B. The connection with the macro-electrodes 31, respectively the heating strips 33', is ensured by flex connectors.

In an alternative, the reading and heating control circuits are produced on one of the substrates 301A or 301B, and a flexible connector extends between the two substrates.

According to another alternative, each of the substrates receives a part of the reading and heating control circuits, and a flexible connector extends between the two substrates.

The idea behind the invention resides in the transfer step described above.

Optionally, the method according to the invention may include the steps of producing first and second elementary stacks 302A, 302B, on the first, respectively the second, substrates 301A, 301B.

The method according to the invention may also include a step of polarisation of the pyroelectric material of the layer 312. This involves subjecting the layer 312 to an intense electrical field, to modify durably the orientation of its molecules, and thereby to confer on it pyroelectric properties.

The invention also covers a system suitable for the implementation of this first embodiment of a method according to the invention. The system includes in particular the first elementary stack 302A, the second elementary stack 302B, the first substrate 301A and the second substrate 301B.

In a sensor as described here, the distance between the contact surface and an upper surface of the charge collection macro-electrodes, on the side of the contact surface, defines a maximum image resolution (heat propagating vertically in the matrix of pixels, but also horizontally, from one pixel to the other of the matrix of pixels).

Preferably, this distance is less than or equal to the pixel pitch of the sensor.

This distance is thus advantageously less than or equal to 150 µm, and even less than or equal to 50 µm or even 10 µm.

When it is wished to access smaller pixel pitches (for example when the sensor is a finger print sensor), there is thus the choice between handling a second substrate of low thickness (for example less than 15 µm), or removing the second substrate after the transfer step (in this case, a protective layer may be added to the second stack, on the second substrate).

When great resolution is not necessary (for example when the sensor forms a simple presence detector, to detect the presence or the absence of a body on a surface, for example the presence or the absence of a hand on a surface), the second substrate 301B may have both a large thickness (more than 100 µm), and be conserved after the transfer step.

Figure 5:
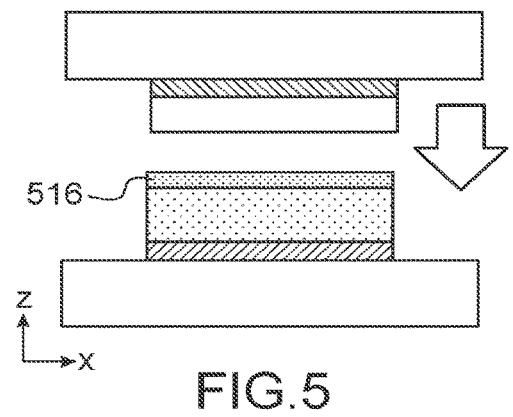

FIGS. 5 and 6 illustrate different alternatives of the method described here above.

In FIG. 5, the adhesive layer 516 is electrically conducting. It forms the upper layer of the first elementary stack, and also acts as electromagnetic shielding layer.

An electrically conducting adhesive is for example an epoxy type adhesive, filled with metal particles, for example filled with silver particles.

This alternative allows that the first and second elementary stacks each include:

a layer including electrically conducting strips (the layer of charge collection electrodes or the heating layer, depending on the stack); and a layer including a material able to exhibit pyroelectric properties, depending on whether it has been subjected or not to a polarisation field (the layer including a pyroelectric material or the electrical insulation layer, depending on the stack).

This alternative facilitates joint production of the first and second elementary stacks. It is particularly suitable when the second substrate is conserved after the transfer step.

Numerous other alternatives may be implemented, where the adhesive layer forms the upper layer of the first elementary stack, and/or the second elementary stack, on the side opposite to the first substrate, respectively second substrate.

In FIG. 6, the second substrate 601B forms a simple transfer substrate, or carrier, for example made of glass, intended to be separated from the second elementary stack at the end of the transfer step. It provides the second elementary stack 602B with the necessary mechanical stability for the implementation of the transfer step. Surface treatments, or the insertion of an intermediate adhesive tie layer, may be implemented on the second substrate 601B, before producing the second elementary stack, to facilitate a future delamination (delamination carried out, for example, with a laser).

Here, a thin protective layer 614 is added to the second elementary stack 602B, between the second substrate 601B and the heating layer 613. The protective layer 614 is for example a layer made of DLC (Diamond Like Carbon), a scratch-resistant resin, an ultra-thin substrate such as a Kapton or a polyimide of 5 to 25 µm thickness, a thin glass substrate, etc.

Preferably, the thin protective layer 614 has a thickness less than or equal to 25 µm, or even less than or equal to 10 µm, and even less (for example a layer of DLC of thickness less than or equal to 1 µm or a layer of scratch-resistant resin deposited by spray or by screen printing of 3 µm thickness).

This embodiment makes it possible to limit the distance between the contact surface of the sensor and the charge collection macro-electrodes, and thereby to improve the resolution of the sensor by limiting diathermy (or cross-talk, or heat exchanges) between neighbouring pixels.

FIGS. 7A and 7B schematically illustrate a second embodiment of a method according to the invention.

According to this embodiment, the first elementary stack 702A and the second elementary stack 702B each extend onto one of two regions of a same substrate 701, and the transfer step is implemented by folding this single substrate 701, such that these two regions lie one above of the other.

The single substrate 701 is here a flexible substrate, for example a substrate made of polyimide of 5 µm to 10 µm thickness, or made of a plastic such as PET, or even glass.

In FIG. 7A is schematically represented, according to a top view, the substrate 701 in the unfolded state, with the two elementary stacks 702A, 702B. The fold line 701' is represented by dotted lines.

Here, the shape of the substrate 701 is adapted so that the heating strips, respectively the charge collection macro-electrodes, each have a so-called "free" end, which is not framed between two portions of the substrate 701 along the axis (Oz). These free ends facilitate the connection to remote reading and heating control circuits.

In FIG. 7B is schematically represented, according to a sectional view, the substrate 701 partially folded with the two elementary stacks 702A, 702B.

This embodiment notably makes it possible to facilitate the production, in a same step of the method, of heating strips and charge collection macro-electrodes.

The invention also covers a system suitable for the implementation of this second embodiment of a method according to the invention. The system includes in particular the first elementary stack 702A, the second elementary stack 702B, and the single substrate 701.

The alternatives described with reference to FIGS. 5 and 6 may be adapted to this second embodiment. It is notably possible to remove, after folding, a region of the substrate 701, initially forming a support for the second elementary stack.

According to another alternative, the substrate 701 may have regions of different thicknesses, the first elementary stack 702A being situated on a region of high thickness, and the second elementary stack 702B being situated on a region of low thickness.

FIG. 8 illustrates an alternative of this second embodiment, in which an integrated circuit 840 is formed on the single substrate 801.

The integrated circuit here includes a silicon chip, bonded on the single substrate 801.

Different electrically conducting tracks, or lines, extend onto the single substrate, in particular:

heating control lines, 841, each extending between the integrated circuit 840 and a first end of each of the heating strips 83';

a ground line, 842, passing through the second ends of each of the heating strips 83', and through at least one edge of the electromagnetic shielding layer 816;

lines of electrodes, 843, each extending between the integrated circuit 840 and a first end of each of the charge collection macro-electrodes 81; and output lines, 844, for the electrical connection of the integrated circuit 840 with external elements.

In this embodiment, the reading and heating control circuits are produced on a same chip, which simplifies synchronisation of the heating with the reading of the quantities of pyroelectric charges, and makes it possible to limit the number of output lines 844 to produce with the exterior by data multiplexing.

The idea behind the invention is thus to manufacture the matrix of pixels in two parts, preferably assembled with adhesive. Thus, prints requiring precision do not suffer loss of resolution linked to the planeness of the lower layers, notably the layer comprising a pyroelectric material. These prints are not affected either by problems of adherence and/or compatibility with lower layers, notably the layer comprising a pyroelectric material. These prints may each be made directly on a substrate.

The transfer step uses two substrates, or two portions of a same substrate, each receiving a part of the layers forming the matrix of pixels of the sensor.

In operation, an object to image or to detect is pressed against a contact surface of the sensor. This contact surface may be situated on one of these two substrates, or one of these two portions of substrate.

In the above description, it is considered that it is the elementary stack comprising the heating strips that is turned over and displaced. In an equivalent manner, it is possible to choose to turn over rather the elementary stack comprising the charge collection macro-electrodes.

In the same way, the adhesive layer may be deposited rather on the elementary stack comprising the heating strips (or even on the two elementary stacks).

Figure 1A:
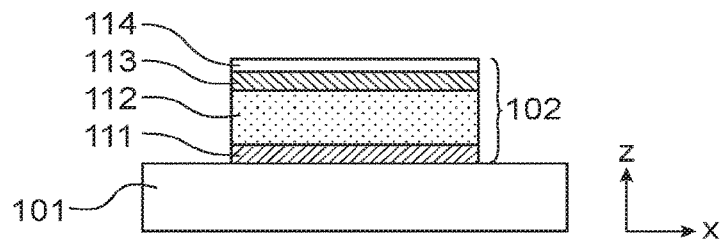
FIGS. 1A to 1C schematically illustrate two alternatives of a first embodiment of a matrix of pixels that can be produced thanks to the method according to the invention.
Figure 1B:
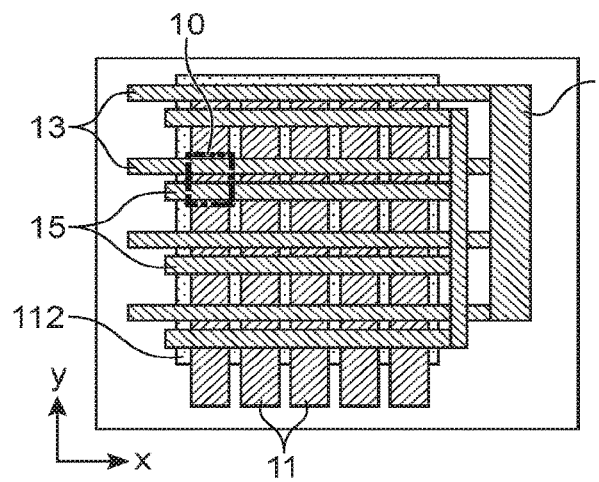
Figure 1C:
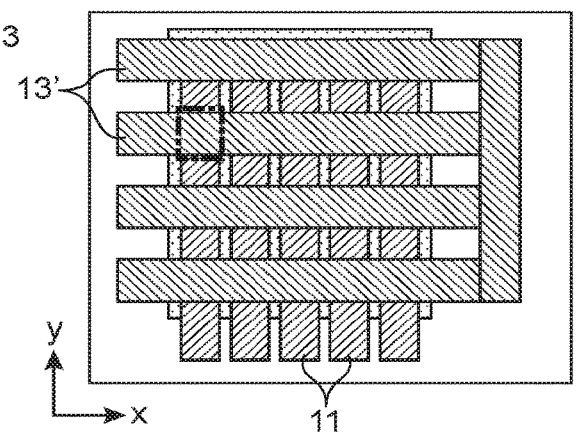

Numerous other alternatives of the method according to the invention may be implemented without going beyond the scope of the invention, for example with different elementary stacks. In particular, the method according to the invention may also serve to produce a stack such as described with reference to FIGS. 1A to 1C.

It is possible to do without an adhesive layer to make the first and second elementary stacks integral with each other. For example, it is possible to produce two elementary stacks each including an upper layer made of pyroelectric material, then to carry out a sintering to make these two layers made of pyroelectric material integral with each other, after the transfer step.

A so-called collective transfer may be carried out, for producing simultaneously several matrices of pixels, from a single or two substrates receiving a plurality of first and second elementary stacks. The substrate(s) may have through openings, to facilitate the access of electrical connectors to the heating strips and/or to the charge collection macro-electrodes.

The first elementary stack may extend initially onto an ultra-thin substrate. After the transfer step, it is possible to bond the assembly obtained onto a more rigid support, for example onto a chip card.

It is also possible to use the method according to the invention to produce a matrix thermal sensor with passive addressing, in which each pixel comprises two superimposed pyroelectric cells, one dedicated to the measurement of a total signal, and the other to the measurement of a noise signal.

The positions of the heating strips and charge collection electrodes may be exchanged. They are not necessarily constituted of a conducting ink.

In the examples represented, heating strips, respectively charge collection macro-electrodes, are directly produced independently of each other. In an alternative, they can be initially connected together, to facilitate a step of polarisation of the layer including a pyroelectric material. Conducting portions connecting them together are eliminated after the transfer step, during a cutting step (for example to separate different matrices of pixels after a collective transfer).

Although not represented, the sensor comprises at least one reading circuit, for measuring a quantity of charges collected by a charge collection electrode, and at least one heating control circuit, for sending electrical signals making it possible to heat the pixels of the sensor through heating strips. It may further comprise an electronic processing circuit able to construct an overall image of a thermal pattern, from measurements carried out at the level of each of the pixels of the sensor.

The thermal pattern that can be imaged by the sensor may be a papillary print, or any other pattern associated with an object having a thermal capacity and a specific heat capacity.

The invention is particularly suitable for the manufacture of sensors of large dimensions (surface of the matrix of pixels greater than 1 cm$^2$). Such sensors are integrated for example on a chip card, an item of clothing, or a portable accessory.

The invention claimed is:

1. A method for producing a matrix of pixels for a thermal sensor, each pixel including a pyroelectric capacitance formed by a portion including a pyroelectric material arranged between a charge collection electrode and a reference electrode, and a heating element, the heating elements of the pixels of a same line of pixels being integrally formed together into a same heating strip, the charge collection electrodes of the pixels of a same column of pixels being integrally formed together into a same charge collection macro-electrode, and the matrix of pixels being constituted of a stack of layers comprising:
   a layer of charge collection electrodes, including a first series of electrically conducting strips parallel with each other, forming the charge collection macro-electrodes;
   a layer including a pyroelectric material, comprising the pyroelectric material portions of each of the pixels; and
   a heating layer, including a second series of electrically conducting strips parallel with each other, forming the heating strips, wherein the layer including a pyroelectric material is located between the layer of charge collection electrodes and the heating layer;
   the method comprising:
   transferring one on the other of a first and a second elementary stack, to form said stack of layers, the first elementary stack including the layer of charge collection electrodes, and the second elementary stack including the heating layer.

2. The method according to claim 1, wherein the first and second elementary stacks are configured so that, after the transferring, the stack of layers includes, superimposed one on top of the other in this order:
   the layer of charge collection electrodes;
   the layer including a pyroelectric material;
   an electromagnetic shielding layer, electrically conducting;
   an electrical insulation layer; and
   the heating layer.

3. The method according to claim 2, wherein:
   at least one of the first and second elementary stacks includes an outer layer including an electrically insulating adhesive; and
   in the stack of layers, the adhesive lies between the heating layer and the electromagnetic shielding layer, and forms the electrical insulation layer.

4. The method according to claim 2, wherein:
   at least one of the first and second elementary stacks includes an outer layer including an electrically conducting adhesive; and
   in the stack of layers, the adhesive lies between the electrical insulation layer and the layer including a pyroelectric material, and forms the electromagnetic shielding layer.

5. The method according to claim 1, wherein at least one of the first and the second elementary stacks includes an outer layer comprising an adhesive, and in that the transferring is followed by a step of cross-linking the adhesive to make the first and second stacks integral with each other.

6. The method according to claim 1, wherein the transferring is carried out by folding a single substrate, the first elementary stack extending onto a first region of the single substrate, and the second elementary stack extending onto a second region of the single substrate.

7. The method according to claim 6, wherein an integrated circuit and electrically conducting lines are situated on the single substrate, the electrically conducting lines each extending between the integrated circuit and one end of a strip of the first series of strips, respectively of the second series of strips.

8. The method according to claim 6, wherein the shape of the single substrate is adapted so that, at the end of the folding, at least one end of each strip of the first series of strips is not covered by the second region of the single substrate, and at least one end of each strip of the second series of strips is not covered by the first region of the single substrate.

9. A system suitable for the implementation of the method according to claim 6, the system comprising:
the first elementary stack, the second elementary stack, and the single substrate, the first elementary stack extending onto a first region of the single substrate, and the second elementary stack extending onto a second region of the single substrate.

10. The method according to claim 1, wherein the transferring is carried out by transfer of one above the other of a first substrate and a second substrate distinct from the first substrate, the first elementary stack extending onto the first substrate, and the second elementary stack extending onto the second substrate.

11. The method according to claim 10, wherein the second substrate is conserved at the end of the transferring, and forms a protective layer in the thermal sensor.

12. The method according to claim 10, wherein the second substrate is removed after the transferring.

13. A system suitable for the implementation of the method according to claim 10, the system comprising:
the first elementary stack, the second elementary stack, a first substrate, and a second substrate distinct from the first substrate, the first elementary stack extending onto the first substrate, and the second elementary stack extending onto the second substrate.

14. The method according to claim 1, further comprising producing the first series of strips and the second series of strips by deposition of a metallic ink.

* * * * *